United States Patent [19]

Nakagome et al.

[11] Patent Number: 4,709,350

[45] Date of Patent: Nov. 24, 1987

[54] SEMICONDUCTOR MEMORY USING MULTIPLE LEVEL STORAGE STRUCTURE

[75] Inventors: Yoshinobu Nakagome, Hachioji; Masakazu Aoki, Tokorozawa; Masashi Horiguchi, Kokubunji; Katsuhiro Shimohigashi, Musashimurayama; Shinichi Ikenaga, Kokubunji, all of Japan

[73] Assignee: Hitachi, Ltd., Tokyo, Japan

[21] Appl. No.: 627,895

[22] Filed: Jul. 5, 1984

[30] Foreign Application Priority Data

Jul. 4, 1983 [JP] Japan ................................. 58-120364

[51] Int. Cl.[4] ............................................. G11C 27/00
[52] U.S. Cl. ........................................ 365/45; 365/184
[58] Field of Search ........................... 365/45, 184, 149

[56] References Cited

U.S. PATENT DOCUMENTS 4,300,210 11/1981 Chakravarti et al. ............... 365/149
4,459,609 7/1984 Fifield et al. ......................... 365/149

Primary Examiner—James W. Moffitt
Attorney, Agent, or Firm—Antonelli, Terry & Wands

[57] ABSTRACT

In a semiconductor memory for reading and writing of stored charge in an X-Y address system by arranging a plurality of memory cells each including a capacitance element and one MOS-FET in matrix, this invention discloses a semiconductor memory using multiple level storage structure for read and write of at least more than two multi-level data stored in the capacitance elements, by applying a multi-level step voltage to the plate electrode of the capacitance or to the gate electrode of MOS-FET so as to write and read signal charge.

15 Claims, 30 Drawing Figures

FIG. 1
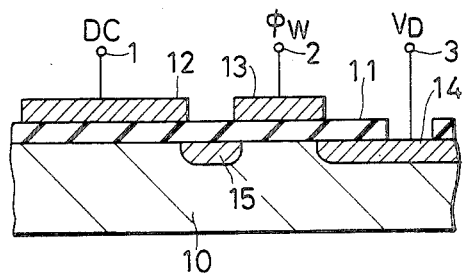
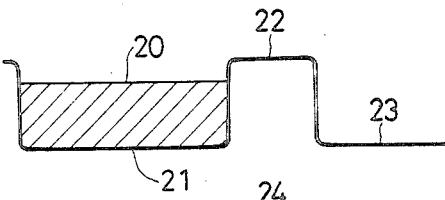
FIG. 2A
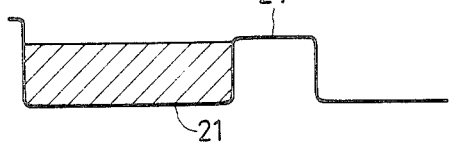
FIG. 2B
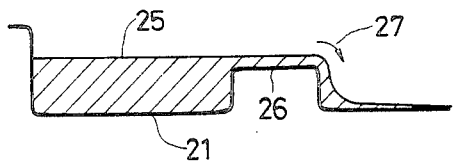
FIG. 2C
FIG. 3
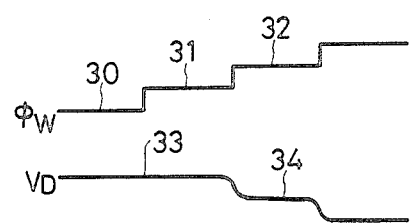

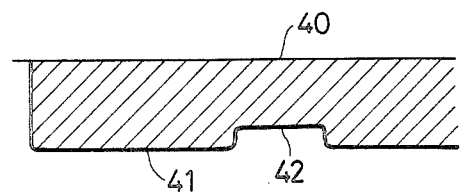
FIG. 4A
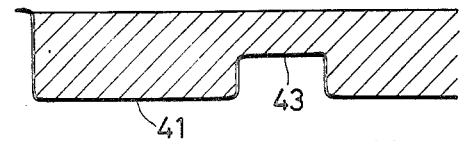
FIG. 4B
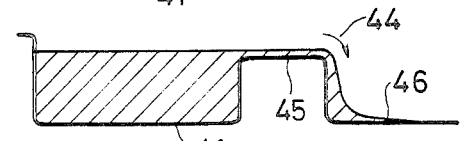
FIG. 4C
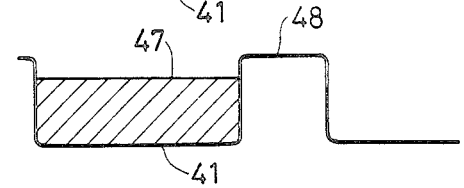
FIG. 4D
FIG. 5
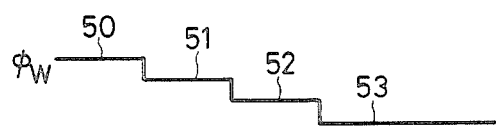
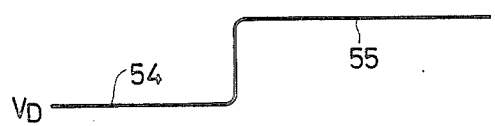

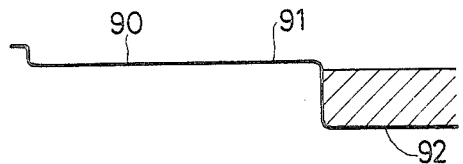
FIG. 9A
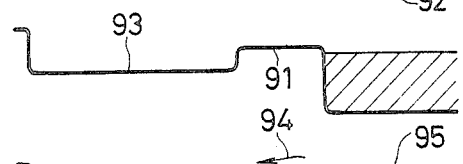
FIG. 9B
FIG. 9C
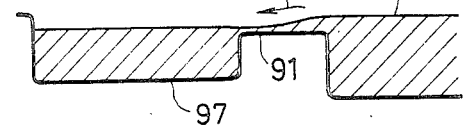
FIG. 9D
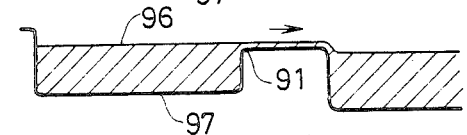
FIG. 9E
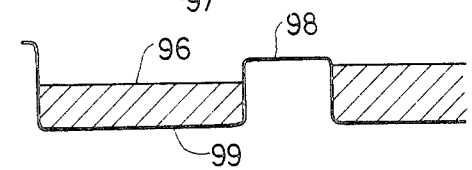
FIG. 10
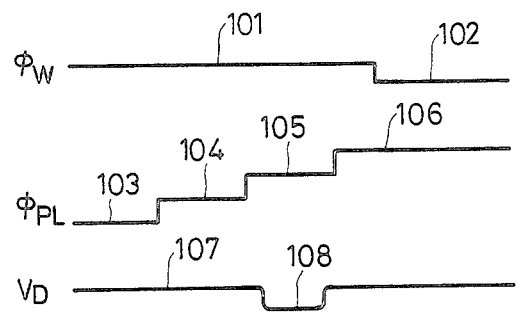

SEMICONDUCTOR MEMORY USING MULTIPLE LEVEL STORAGE STRUCTURE

BACKGROUND OF THE INVENTION

This invention relates to a semiconductor memory, and more particularly to a semiconductor integrated circuit memory.

As typified by a dynamic random access memory (DRAM) or a semiconductor memory using a charge coupled device (CCD memory), a semiconductor memory having a high integration density stores data by making the existence and absence of charge inside a potential well on a semiconductor surface correspond to digital signals "1" and "0".

However, this storing method involves the problem that in the case of DRAM, for example, only binary 1-digit (1-bit) data can be handled for each unit memory cell, and hence the amount of total bits per chip is limited.

Particularly in the charge storage type memory such as described above, charge leaks from a pn junction formed essentially in a charge storage portion so that the data can be stored only for a limited period of time. This results in another problem that a mechanism for rewriting (refreshing) the stored data on a certain cycle of time within that period is essentially necessary.

The CCD memory has a structure in which the stored charge is cycled using a transfer electrode. In order to effect rewrite (refresh), therefore, the stored charge is transferred along a CCD transfer electrode loop arranged cyclicly, and the charge must be read and written at an input-output portion disposed at a predetermined position inside the CCD loop on a certain cycle of time. However, a great deal of power is necessary to charge and discharge the transfer electrodes for transferring the charge in order to refresh all data, and it has therefore been difficult in the past to provide a memory having low power consumption.

Semiconductor memories having higher integration density as exemplified by a semiconductor dynamic random access memory (hereinafter called "DRAM") have been developed every year, and miniaturization of unit memory cells (hereinafter called "memory cells") of the semi-conductor memory and its peripheral circuits is ever-increasing. In order to improve the integration density by miniaturization such as described above, however, a drastic improvement must be made in device process techniques such as photolithography, etching and the like. Unfortunately, a considerably long period of time is generally necessary before improved device process techniques are developed.

In contrast, demands for very high integration density semiconductor memories are ever-increasing, and semiconductor memories having low power consumption are earnestly required in a novel field of application such as miniature computers for office use and their peripheral terminals that have made remarkable progress in recent years. For these reasons, existing semiconductors are not entirely satisfactory not only in their integration density but also in their performance charactertistics such as power consumption.

To fulfil the demands described above, semiconductor memories using multiple level storage structure (MLS memories) are believed to be effective means that can realize very high integration density semiconductor memories and are available in accordance with the existing process technique. The memory improves substantially the integration density by storing data of at least more than two levels per memory cell.

A multi-level storage memory using a charge coupled device (hereinafter called "CCD") has been known in the past. The memory is described in detail in L. Terman et al. IEEE Journal of Solid-State Circuits, Vol. sc-16, No. 5, pp. 472–478, Oct. 1981, and M. Yamada et al, Proceedings of the 9th Conference on Solid-State Devices, Tokyo, 1977, pp. 263–268, issued on Jan., 1978, for example.

However, the multi-level storage memory using the charge coupled devices (CCD) has not been put into much practical application for the following reasons.

(1) Since signal charge transfer inefficiency is not zero in CCD, analog signal charge corresponding to multi-level data damps with the charge transfer, and hence the number of multi-levels can not be increased very much.

(2) The amplitude of a driving pulse must be increased in order to improve the signal charge transfer efficiency, and this results in extremely great power consumption in addition to the inherent property of the cell that it has originally large capacitance load.

(3) Since A/D and D/A convertors having high accuracy are necessary for each CCD loop, the integration density can not be increased due to the limitation of peripheral circuits, even if the memory cell can be miniaturized.

SUMMARY OF THE INVENTION

The present invention is therefore directed to provide a multi-level storage semiconductor memory (MLS memory) which eliminates the problems described above and can simultaneously accomplish low power consumption and large memory capacity. The present invention realizes a very high integration density MLS memory by introducing a novel concept that has not been known in the past.

It is another object of the present invention to provide a multi-level storage semiconductor memory using addressing by both rows and columns.

Since the present invention employs addressing by both rows and columns for the construction of the MLS memory, the present invention can provide a large capacity memory which has low power consumption but can select random memory cells.

The present invention introduces an entirely novel concept that a multi-level step voltage is applied to a word line or a plate so as to read the data at the timing at which stored charge flows out, and writes the data to the memory cell at the timing which corresponds to an input signal. The present invention can realize efficiently a very high density semiconductor memory on the basis of this novel concept.

BRIEF DESCRIPTION OF THE DRAWINGS

FIG. 1 is a sectional view of a memory cell of a word line driving system;

FIGS. 2A through 2C are schematic views showing the potential with respect to electrons along the surface of a semiconductor layer in the read mode of the memory cell of the word line driving system;

FIG. 3 is a diagram showing the change of a word line voltage and a bit line voltage in the read mode of the memory cell of the word line driving system;

FIGS. 4A through 4D are schematic views showing the potential with respect to electrons along the surface of a semiconductor layer in the write mode of the memory cell of the word line driving system;

FIG. 5 is a diagram showing the change of a word line voltage and a bit line voltage in the write mode of the memory cell of the word line driving system;

FIGS. 9A through 9E are schematic views showing the potential along the surface of a semiconductor layer in the write mode of the memory cell of the plate driving system;

FIG. 10 is a diagram showing the change of a word line voltage, a plate voltage and a bit line voltage in the memory cell of the plate driving system;

DESCRIPTION OF THE PREFERRED EMBODIMENTS

Figure 6:
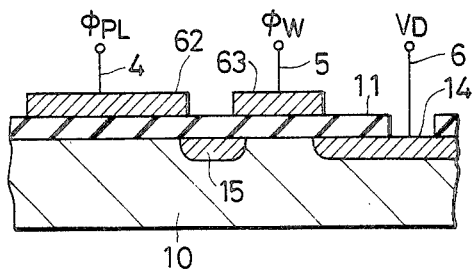
FIG. 6 is a sectional view of a memory cell of a plate driving system.

First of all, the principle of the reading and storing operations of the multi-level (three or more levels) charge storage state as the basis of the MLS memory of the present invention will be described.

FIG. 1 illustrates the sectional structure of a memory cell in accordance with the first principle of the invention and the kind of applied voltages. For convenience' sake, the memory based on the later-appearing principle will be hereinafter called a "word gate driving MLS memory". Although the electron is dealt with as the stored charge, the principle can be applied exactly in the same way to the positive hole by converting the conductivity type of a semiconductor and inverting the voltage for operating the memory.

In the drawing, reference numeral 10 represents a p-type semiconductor layer (a substrate of a semiconductor layer disposed on the substrate), reference numeral 11 is a gate insulating film (oxidized film or the like), and reference numerals 12 and 13 are electrodes formed on the gate insulating film. Reference numerals 14 and 15 represents highly doped n-type semiconductor layers formed in self-alignment with the electrodes by ion implantation, or the like, respectively. The electrode 13 corresponds to the gate of an insulated gate field effect transistor (MOS-FET), and the n-type semiconductor layers 14 and 15 correspond to the drain or source of the transistor. When a positive voltage is applied to the plate electrode 12, an inversion layer which is induced on the surface of the semiconductor layer 10 is electrically coupled with the n-type semiconductor layer 15, thereby forming a capacitance in cooperation with the electrode 12 and making it possible to store the electrons in the inversion layer. When this memory cell is used in a memory device consisting of a two-dimensional arrangement, the gate 13 of MOS-FET is connected to an address decoded row line (word line) 2, and the drain 14, to an address decoded column line (bit line) 3 to form a memory matri. The electrode 12 is connected in common to all the memory cells, and a positive D.C. voltage is applied to it.

FIGS. 2A, 2B and 2C illustrate the surface potential to the electrons along the surface of the semiconductor layer of the memory cell shown in FIG. 1. FIG. 2A illustrates the charge storage mode. The stored charge 20 in the potential well 21 below the plate is isolated from the bit line 23 by a potential barrier 22 below the gate of MOS-FET, and from the other regions by the potential barrier of an isolation region disposed around the memory cell. When read of the multi-level charge state is effected, multi-level step voltages $\phi w$ (30, 31, 32) that shifts from a low voltage to a high voltage are applied to the word line 2 as shown in FIG. 3. In the drawing, reference numeral 30 corresponds to FIG. 2A, 31 to FIG. 2B, and 32 to FIG. 2C. When the voltage $\phi w$ is increased in a positive direction, the potential barrier below the gate of MOS-FET drops in the sequence of 22→24→26 as shown in FIGS. 2A, 2B and 2C, and when it becomes below the surface potential at a storage node 25 (the state represented by 26), the charge flows out (27) from the storage portion to the bit line. FIG. 3 illustrates the mode of drop of the bit line voltage VD (33, 34) caused by the outflow of the charge.

As described above, the storage state of the charge having three or more levels can be discriminated by detecting the timing at which the difference between the potential barrier below the gate of the word line and the potential at the storage portion, when the former is gradually reduced, is inverted, as the change of the bit line voltage VD.

Next, the principle of the writing mode of the multi-level charge storage state will be described. FIGS. 4A through 4D are schematic views showing the concept of the potential on the surface of the semiconductor layer when the multi-level charge is stored, and FIG. 5 shows the change, with time, of the word line and bit line voltages when charge storage is effected. FIGS. 4A through 4D correspond to the state of application of the voltages represented by reference numerals 50 through 53 in FIG. 5, respectively. Before writing is executed the word line applied voltage $\phi w$ is set in advance to the highest level so that the potential barrier below the gate of the word line become minimal (42), while the data line voltage VD is set in advance to the lowest level 54 at which the potential well 41 of the storage portion is filled by the charge 42 (for example, to the ground potential). Next, the multi-level step voltage $\phi w$ (50-53) shown in FIG. 5 is applied to the word line.

Then, the bit line voltage VD is raised from 54 to 55 as shown in FIG. 5 at the timing at which the potential barrier (43, 45, 48) below the gate of the word line is in agreement with the surface potential which corresponds to the amount of charge to be stored finally, and the charge is extracted (44) from the bit line 46 as shown in FIG. 4C. FIG. 4D shows the final charge storage state (stored charge 47).

Next, the reading and storing operation of the multi-level (three or more levels) charge storage state in the memory cell in accordance with the second principle will be described. Hereinafter, this principle will be called a "plate electrode driving MLS memory" to distinguish it from the word gate driving system described earlier for convenience' sake.

FIG. 6 illustrates the sectional structure of the memory cell and the applied voltage. This memory cell is not much different in its cross-sectional structure from the word gate driving system described already, and the difference is that unlike the system described already, the plate electrode 62 forming the charge storage portion is independent for each row and is disposed in parallel with the word line gate 63.

Figure 7A:
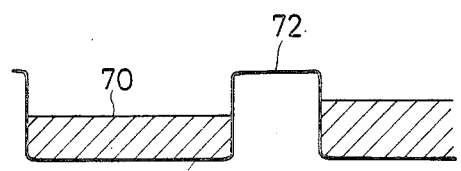
FIGS. 7A through 7D are schematic views showing the potential with respect to electrons along the surface of a semiconductor layer in the read mode of the memory cell of the plate driving system.
Figure 7B:
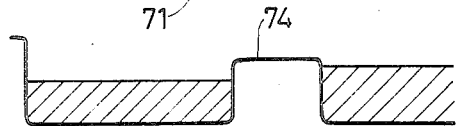
Figure 7C:
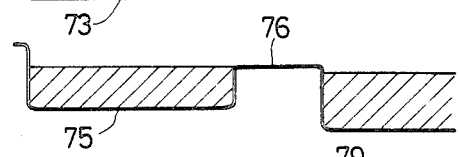
Figure 7D:
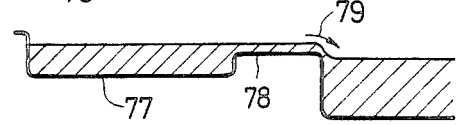
Figure 8:
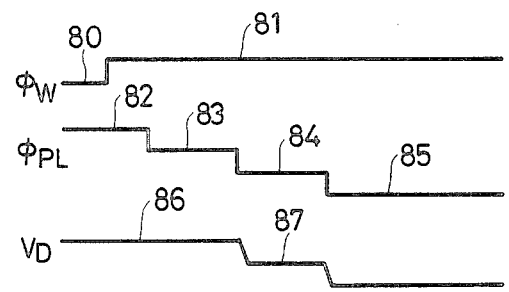
FIG. 8 is a diagram showing the change of a word line potential, a plate voltage and a bit line voltage in the read mode of the memory cell of the plate driving system.

FIGS. 7A, 7B, 7C and 7D illustrate the principle of discriminating the storage states of the multi-level charge in accordance with this system. A low voltage 80 is applied to the word line 5 in order to prevent the leakage of the charge 70 of the storage portion to the bit line during holding of the charge and to sufficiently raise the potential barrier (72) below the word line gate. During the read operation, a voltage 81 which is higher than that during data holding is applied to the selected row to reduce the potential barrier (74, 76, 78) below the word line gate so that the charge flowing out from the storing portion is caused to flow only through the bit line. Under this selected state, when the voltage $\phi_{PL}$ of the second row address line (plate) 62 disposed in parallel with the word line is decreased gradually and step-wise (82-85) as shown in FIG. 8, the depth of the potential well on the surface of the semiconductor layer becomes smaller in response to the potential (71→73→75→77), and the surface potential rises. FIGS. 7B through 7D illustrate this state. When the surface potential at the storage node becomes higher than the potential barrier below the word line gate that is set previously, the flow of charge 79 to the bit line such as shown in FIG. 7D occurs. Thus, the charge storage state of the multilevel (three or more levels) can be discriminated by detecting the timing of the change of the bit line voltage VD (change of 86→87 in FIG. 8) in the same way as in the word gate driving system.

Likewise, the principle of the writing operation of the storage state of the multi-level (three or more levels) charge in this plate electrode driving system will be described. FIGS. 9A through 9E illustrate the potential along the surface of the semiconductor layer of the memory cell during the storing operating, and FIG. 10 illustrates the voltage waveform at each portion of the memory cell when the storing operating is conducted.

The potential 92 of the bit line is set to a level somewhat lower than the potential barrier (91) below the word line gate in the selected state before the storing operation is effected. Multi-level step voltage $\phi_{PL}$ (103-106) which changes from a low voltage to the high is applied to the plate. The potential well below the plate is thus made deeper gradually (90, 93, 97, 99). When a voltage 104 shown in FIG. 10 is applied to the plate, the potential well occurs as shown in FIG. 9B, but the charge is not injected. To effect the writing operation, a pulse 108 in a negative direction is applied to the bit line while the multi-level step voltage $\phi_{PL}$ keeps a constant value 105, as shown in FIG. 10. The mode 94 of injection of the charge 95 in this case is shown in FIG. 9C. The amount of charge 96 determined by the potential barrier 91 below the word line gate and the depth of the potential well below the plate can be stored inside the potential well (FIG. 9D) by returning the drain voltage to the value 107 during the same period.

FIG. 9E illustrates the charge storage state. (The word line voltage is reduced; 101→102.)

Hereinafter, three embodiments of the invention will be described.

Embodiment 1

Figure 11:
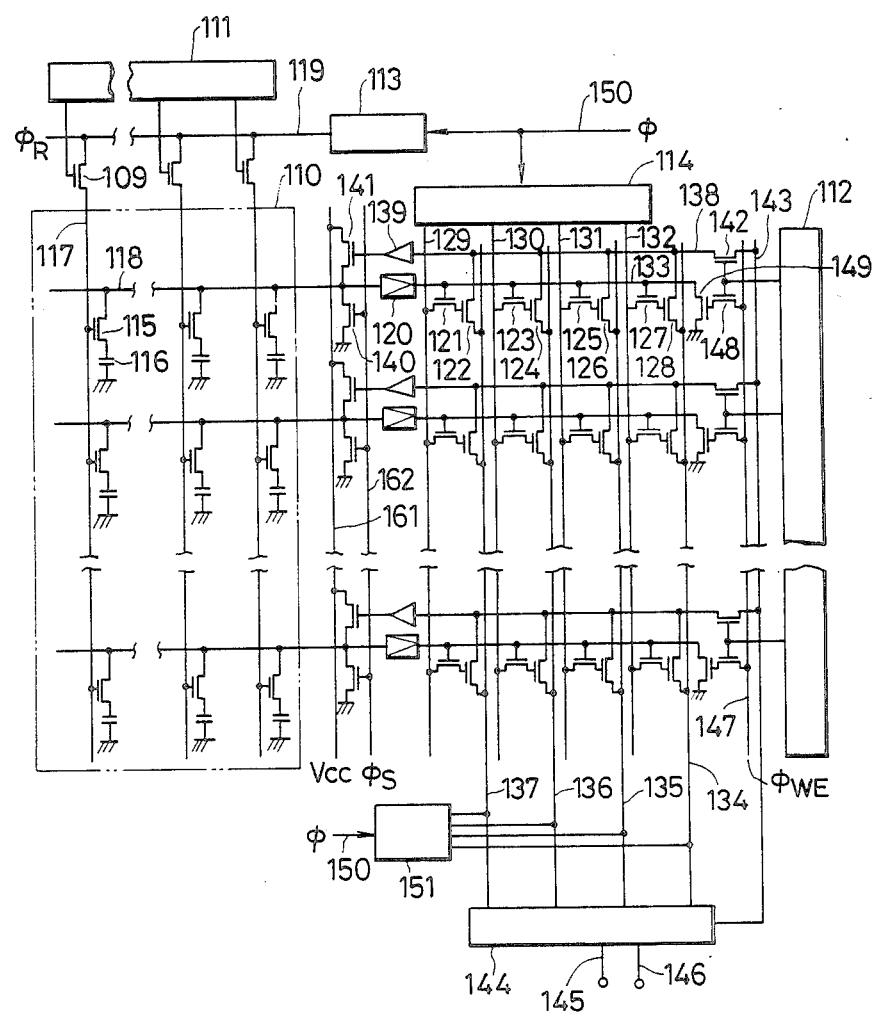
FIG. 11 is a circuit diagram showing a memory array, a read circuit and a write circuit of a semiconductor memory using a memory cell of a word line driving system.

FIG. 11 illustrates an example of a memory using a multi-level storage structure in which a memory cell of the word gate driving system is used as each unit memory. In the drawing, a memory cell is shown constituted by n-channel MOS-FET 115 and a charge storing portion 116. Reference numeral 111 represents a row address select circuit, which selects only one row from a plurality of rows. In order to select a word line 117, a predetermined voltage is applied from the row address select circuit to the gate of a row address select transistor 109, which is connected to the word line 117, so as to render the transistor 109 conductive. In the case of the n-channel MOS transistor shown in this embodiment, a power source voltage $V_{cc}$ or a voltage higher than the former is applied to the gate. Reference numeral 113 represents a multi-level step voltage generator, and the output of this generator is connected to the word line 117 through the transistor 109. The multi-level step generator 113 is driven by a triggering pulse $\phi 150$.

On the other hand, a highly sensitive sense amplifier 120 is connected to one of the ends of a bit line 118. This amplifier consists of a pre-sense circuit which amplifies a minute change of the bit line potential by voltage amplification or the like, and a main sense circuit which amplifies the output of the pre-sense circuit to a logic swing inside the memory, and drives level storage cells consisting of n-channel MOS-FETs. In this embodiment, the output line 133 is discharged from the power source potential $V_{cc}$ to the ground potential $V_{ss}$ at the time at which a signal is detected on the bit line. Eight transistors 121 through 128 constitute 4-level temporary storage cells. Two transistors store one level. Accordingly, this embodiment can discriminate and read four levels of charge storage state (2 bits). In the 4-level temporary storage cells, two signal lines for one level (or 8 signal lines in all) are disposed so as to cross the output lines of the amplifier described above. Four lines 129 through 132 are read signal lines which operate at the time of data read, while the lines 134 through 137 are write signal lines which operate at the time of data storage, respectively. The read signal lines are connected to a read reference signal generator 114. In this embodiment, a shift register is used as the read reference signal generator, which produces the power source voltage $V_{cc}$ in the time sequence of 129-132 in synchronism with the multi-level step voltage under the control of the triggering pulse 150.

When the output line 133 of the amplifier is set in advance to $V_{cc}$ and when it is discharged to the ground potential $V_{ss}$ at the timing of the flow-out of the charge, the logic data of the read signal lines 129 through 132 are temporarily stored as the potentials of the gate terminals of the transistors 122, 124, 126 and 128. In this manner, the mutually different multilevel charge data produced from the memory cells aligned on the same row to the respective data lines are temporarily held as the logic swing data stored in the 4-level temporary storage cells connected to the respective bit lines.

Figure 12:
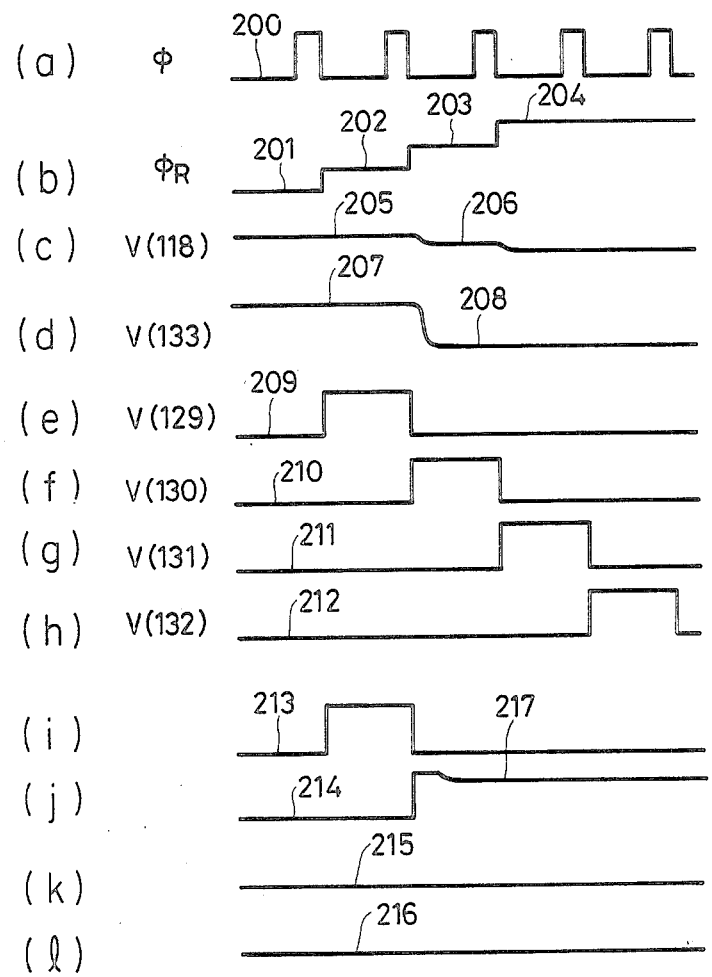
FIG. 12 (a-1) is a pulse chart showing the voltage waveform at each portion in the read mode of the semiconductor memory shown in FIG. 11.

FIG. 12 illustrates the voltage waveform at each portion corresponding to the read operation. FIGS. 12(a) through 12(d) illustrate the triggering pulse φ, the word line potential $φ_R$, the bit line potential, and the output voltage of the sense amplifier, respectively. FIGS. 12(e) through 12(h) illustrate the voltage of read reference signal lines. FIGS. 12(i) through 12(l) illustrate the gate potentials of the transistors 122, 124, 126 and 128 of the temporary storage cells, respectively. In this embodiment, a potential 217 which is lower by the threshold voltage of the gate of the transistor 123 than the power source voltage $V_{cc}$ is temporarily held at the gate of the transistor 124, making the transistor 124 conductive.

Figure 14:
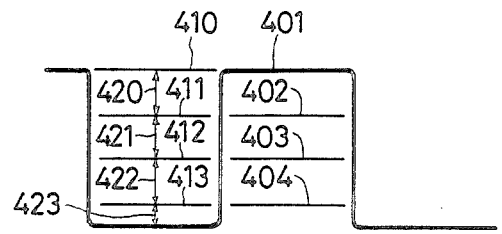
FIG. 14 is a diagram showing the surface potential of the memory cell and useful for explaining the read of 4-level charge storage state.

FIG. 14 illustrates the potential along the memory cell section corresponding to the read operation of the 4-level charge storage state shown in this embodiment. The potential barriers below the word line gate corresponding to the word line voltages ($φ_R$) 201, 202, 203 and 204 are represented by 401, 402, 403 and 404, respectively. When the word line voltage $φ_R$ is discharged from 401 to 402, the flow-out of charge occurs when the surface potential of the charge storing portion is higher than 411, whereby the amplifier 120 operates and a voltage lower by the threshold voltage of the transistor 121 than $V_{cc}$ is stored at the gate of the transistor 122. Similarly, with the drop of the voltage $φ_R$ from 202→203, 203→204, the flow-out of charge occurs when the surface potential of the charge storing portion is within the potential range of between 411 and 412 and between 412 and 413, and the potentials lower by the threshold voltage than $V_{cc}$ are stored at the gates of the transistors 124 and 126, respectively.

If the surface potential of the charge storage portion is below 413 the flow-out charge does not occur to the end. In such a case, the potential of the output line 133 of the amplifier is reduced so as to store a potential, which is lower by the threshold voltage than $V_{cc}$, at the gate of the transistor 128 in synchronism with the voltage pulse 212. When the operation described above is carried out, the information, in which of the four ranges 420, 421, 422 and 423 in FIG. 4 the surface potential of the storage portion is positioned, is transferred to the data of the temporary storage cells outside the memory cell array. These four levels can be made to correspond to the digital binary signals (1, 1), (1, 0), (0, 1) and (0, 0), respectively.

Next, the operation at the time of charge storage (writing) will be explained. First, a reset pulse $φ_s$ is applied to a line 162, and each data line 118 is reduced to $V_{ss}$ (base potential) through MOS-FET 140. Then, the signal generator 151 operates in synchronism with the triggering pulse φ. This embodiment uses a shift register as the write signal generator, which produces in a time sequence a power source potential $V_{cc}$ from 134 to 137 in synchronism with the multi-level step voltage $φ_R$. On the other hand, the temporary storage cell output line 138 is connected to the write signal line 136 through the transistor 124 storing temporarily $V_{cc}$ at its gate. Accordingly, $V_{cc}$ is produced to the temporary storage cell output line 138 for the first time when the write signal line 136 reaches $V_{cc}$. In other words, the logic data corresponding to the 4-level voltages stored temporarily in the temporary storage cells and the 4-level logic data of the write signal lines are compared, and only when they are in agreement with one another, the temporary storage cell output line 138 shifts to the high logic level, rendering the write trnaistor 141 conductive through the buffer 139 and raising the potential of the bit line 118 (rises to $V_{cc}$) As already described generally, the charge corresponding to the potential barrier below the 4-level word line gate is thus left in the charge storage portion, and the write operation is completed.

As described above, this embodiment represents that the rewriting operation (refresh operation) which is essential in a charge storage type semiconductor memory can be accomplished easily.

Figure 13:
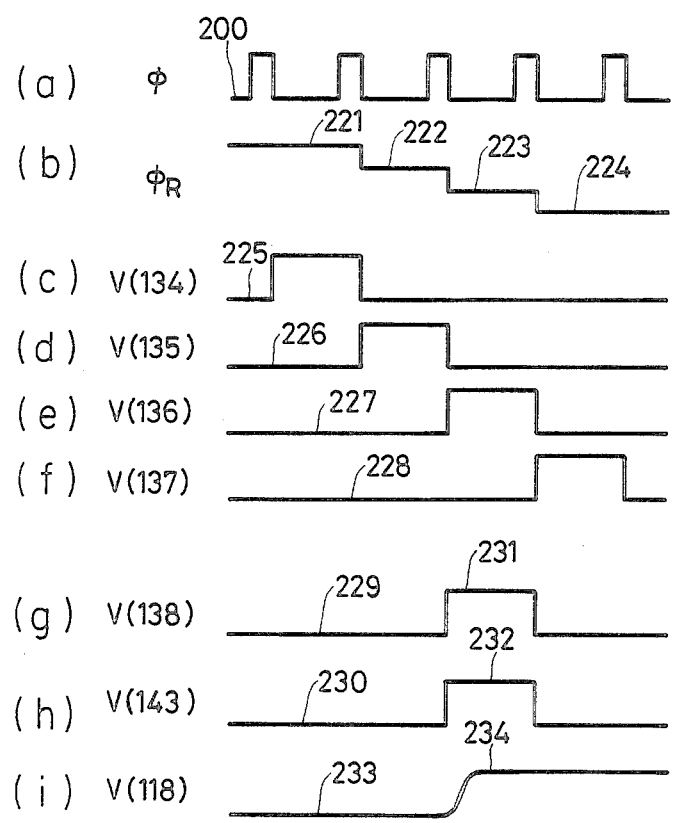
FIG. 13 is a pulse chart showing the voltage waveform at each portion in the write mode of the semiconductor memory shown in FIG. 11.

FIG. 13 illustrates the voltage waveform at each portion during the writing operation. FIGS. 13(a) and 13(b) illustrate the waveforms of the triggering pulse φ and the word line potential $φ_R$, respectively, FIGS. 13(c) through 13(f) illustrate the waveforms of the potentials of the write reference signal lines 134 through 137, respectively, FIG. 13(g) illustrates the waveform of the potential of the temporary storage cell output line 138, and FIG. 13(i) does the waveform of the bit line potential 118.

Figure 15:
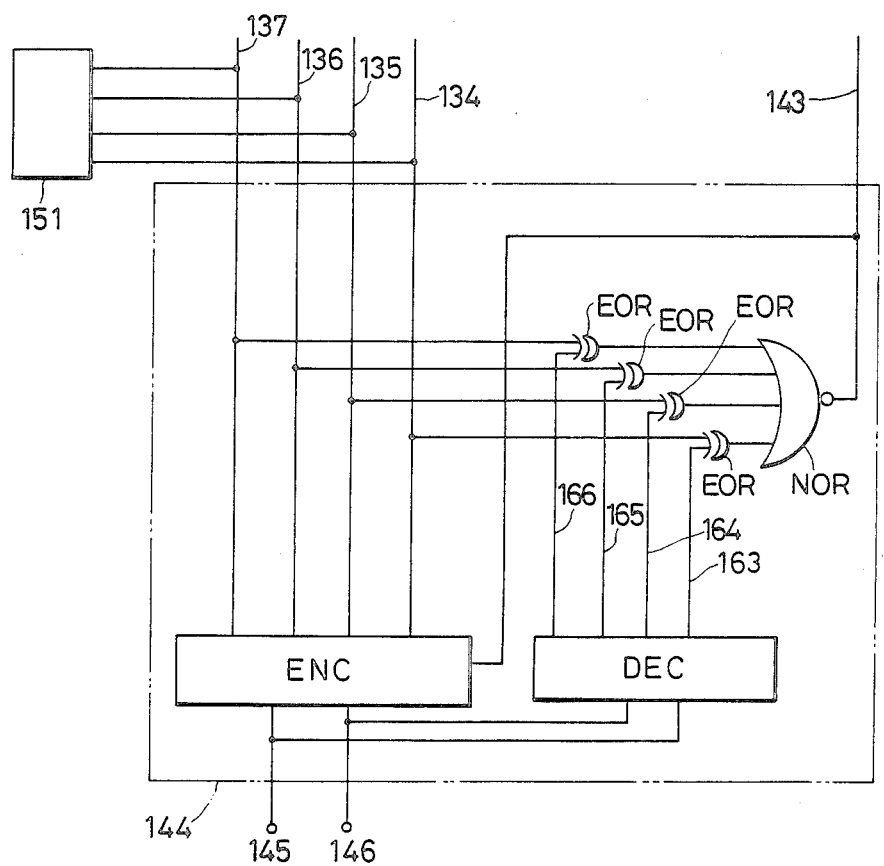
FIG. 15 is a circuit diagram showing an interface circuit of the semiconductor memory shown in FIG. 11.

To produce the read data outside the semiconductor memory, a column address select circuit 112 is further added. A transistor 142 is connected to the output line of the 4-level temporary storage cell 138 selected by the select circuit 112 and to a common data line 143. Therefore, when the output line of the temporary storage cell 138 shifts to $V_{cc}$ during the writing operation, the common data line 143 shifts simultaneously to $V_{cc}$ (FIG. 13(h)). As shown in FIG. 15, a 4-level to 2-bit encoder ENC is disposed inside an interface circuit. This encoder ENC produces the 4-level logic data appearing on the write signal lines 134–137 in synchronism with the shift of the common data line 143 to the high level as the 2-bit binary signals to input-output terminals 145 and 146.

Next, the rewriting operation of the stored data will be described. This rewriting operation is conducted only for the column which is selected by the column address select circuit 112. When the rewriting operation is made, it is necessary to make the temporary storage cells inactive before the start of the rewriting operation. For this purpose, the output line of the amplifier 133 for the selected column is discharged to $V_{ss}$ by a write enable signal $φ_{WE}$ through the transistor 149. Accordingly, the data thus read out are not held in the temporary storage cells.

The digital binary signals corresponding to the rewrite data that are applied from outside through the terminals 145 and 146 are decoded by a decoder DEC disposed inside the interface circuit 144, and shift one of the output lines of the decoder 163–166 to $V_{cc}$ and the rest, to $V_{ss}$. On the other hand, $V_{cc}$ is produced in the time sequence to the four write signal lines 134 through 137 in the same way as in the rewriting mode in the refresh cycle described already, and the signal and the previous decoder output signals are compared with each other, so that the common data line 143 is changed from $V_{ss}$ to $V_{cc}$ at the timing at which both signals coincide with each other (see FIG. 15).

In FIG. 15, EOR is an exclusive-OR circuit (EOR gate) and NOR is an inversion logic summation circuit (NOR gate). This signal is transmitted to the output line 138 of the temporary storage cells through the transistor 142 to actuate the write transistor 141. As a result of the operation described above, the 2-bit digital signal applied from outside the semiconductor memory can be written as a 4-level voltage state into a memory cell positioned at the point of intersection of one row address line and one column address line.

Embodiment 2

Figure 16:
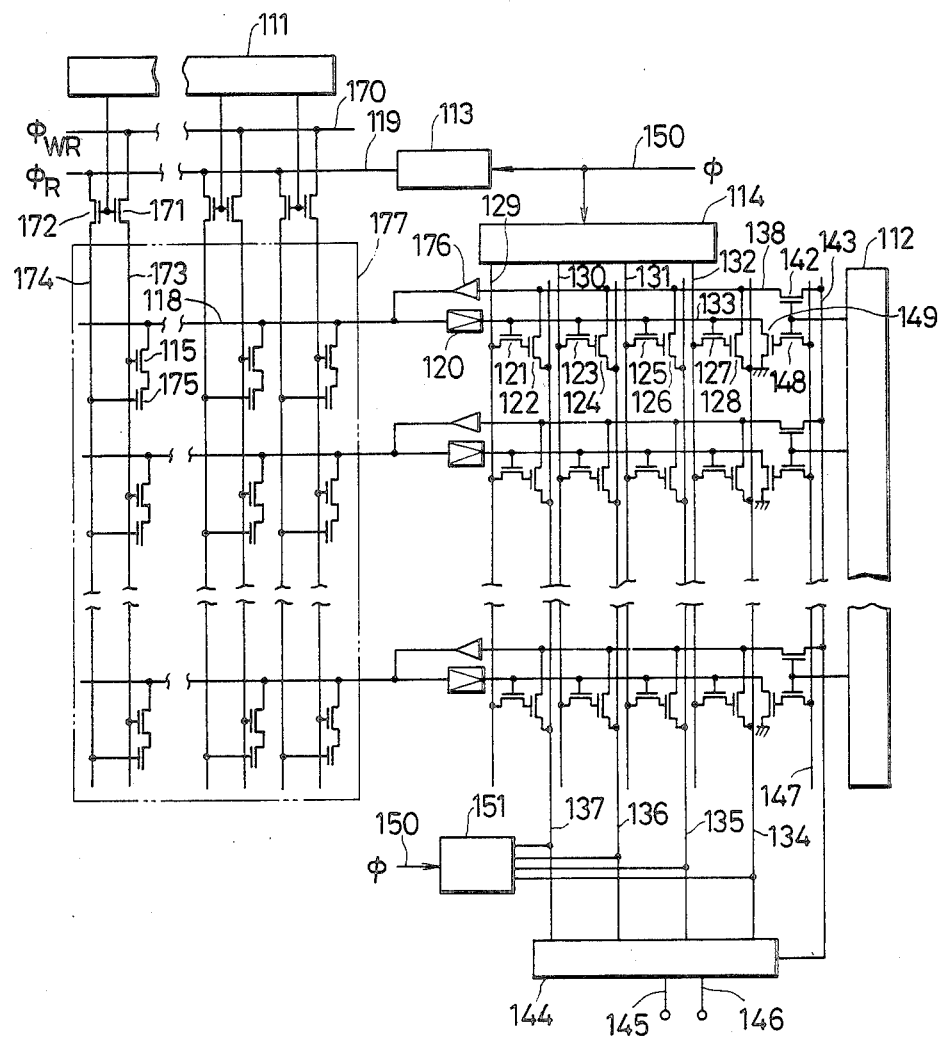
FIG. 16 is a circuit diagram showing a memory array, read circuit and write circuit of a semiconductor memory using a plate driving system.

FIG. 16 illustrates an example of a semiconductor memory using the multiple level storage structure, which uses plate driving type memory cells as the unit memory cells. In the drawing, an n-channel MOS-FET 115 and a MOS type charge storing portion 175 constitute a memory cell. A first row address select line (word line) 173 is connected to the gate of MOS-FET of the memory cell, while a second row address select line 174 is connected to the electrode (plate) of the MOS charge storage portion 175. The first and second row select lines that are parallel to each other are connected to a potential application line $\phi_{WR}$ 170 of the word line and to the output line $\phi_R$ 119 of the multi-level step wave through the row address select transistors 171 and 172, respectively. The row address select transistors 171 and 172 are simultaneously selected by the row address select circuit 11. The constructions other than the write circuit are the same as those of the embodiment 1 described already.

Figure 17:
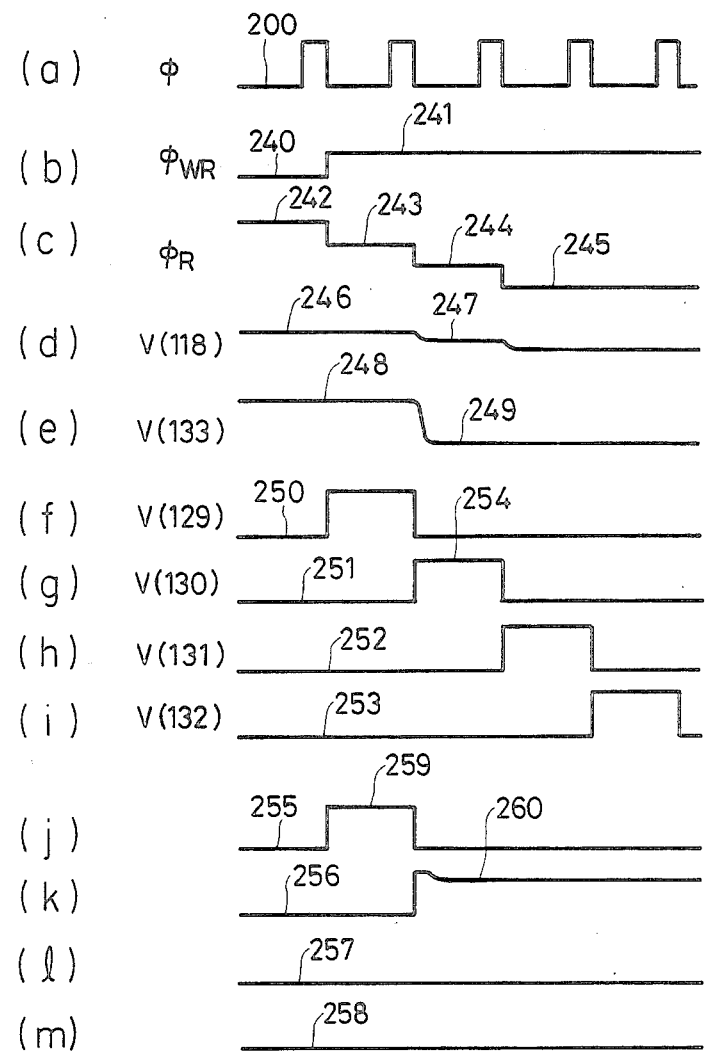
FIG. 17 (a-m) is a pulse chart showing the voltage waveform at each portion in the read mode of the semiconductor memory shown in FIG. 16.

FIG. 17(a-m) illustrates the voltage waveform at each portion during the read mode. The process in which the charge flows onto the data lines by $\phi_{WR}$ and $\phi_R$ has been described in detail in the foregoing "Summary of the Invention". The other processes of the read mode are the same as those of the Embodiment 1 and are therefore omitted.

Figure 18:
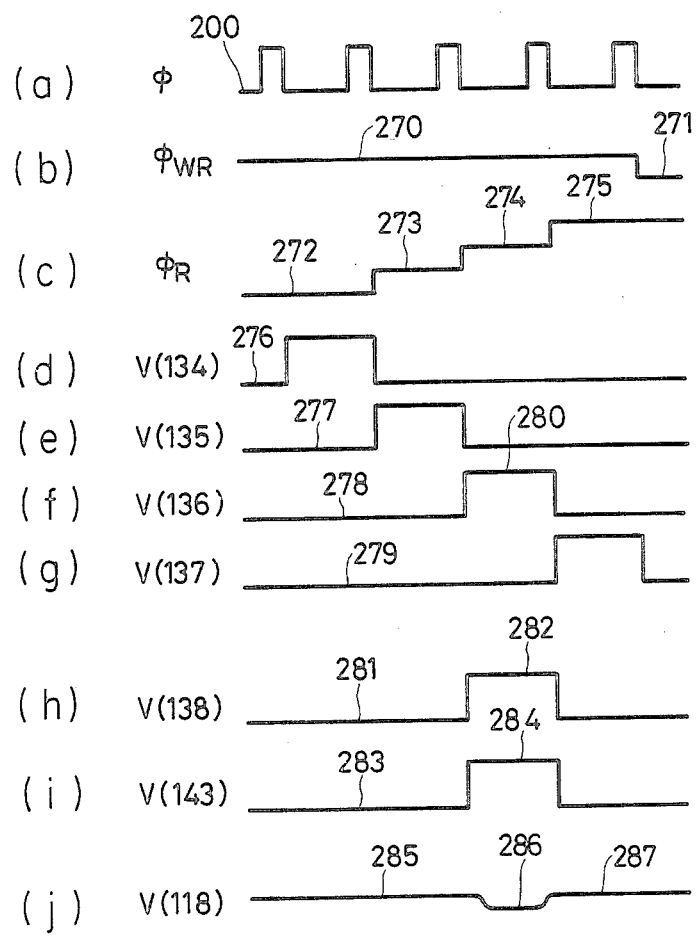
FIG. 18 (a-j) is a pulse chart showing the voltage waveform at each portion in the write mode of the semiconductor memory shown in FIG. 16.

FIG. 18(a-j) illustrates the voltage waveform at each portion during the write mode. In the write mode, the output line 138 of the temporary storage memory cells actuates the pulse generator 176 (in FIG. 16) so as to generate a potential change such as shown in FIG. 18(j). Since the other operations are the same as those of the Embodiment 1, their description is hereby omitted.

What is claimed is:

1. A semiconductor memory of an X-Y address system comprising:
    a plurality of row address lines (word lines);
    a plurality of column address lines (bit lines) disposed in parallel with one another to cross said row address lines;
    memory cells disposed at points of intersection and each holding a charge storage state having one of at least three levels;
    writing means coupled to said cells; and
    reading means coupled to said cells,
    wherein said reading means and said writing means are respectively provided for each of said column address lines; and
    means for applying voltages of at least three levels in a time sequence to a plurality of said memory cells selected by one row address line in the read mode or in the write mode, respectively, whereby reading of the stored data of at least three levels stored in said selected memory cells or writing of the stored data of at least three levels into said selected memory cells is simultaneously carried out in a plurality of said memory cells.

2. In a semiconductor device comprised of a plurality of row address select lines, a plurality of column address select lines disposed to cross said row address select lines and charge storage type semiconductor memory cells each comprised of one MIS (Metal-Insulator-Semiconductor) type charge storage portion and one insulated gate transistor (MIS-FET) and disposed at the points of intersection, the gate of each said MIS-FET being connected to the first of said row address select lines, the source or drain of each said MIS-FET being connected to said column address select line, and the plate electrode of said charge storing portion being connected to the second of said row address selected lines disposed in parallel with said first row address select line; the semiconductor device usng a multiple level storage structure as defined in claim 1 wherein said semiconductor device is equipped with a reading means and a writing means, a binary voltage corresponding to the selection and non-selection of the rows being applied to said first row address line, a multi-level step voltage having more than two potential states and changing from a high voltage to a low voltage or vice versa is applied to the second row address line forming a pair together with a selected first row address, said reading means being a timing detector which detects the timing at which the charge flows out from said charge storage portion of each of said memory cells to each of said column address lines, and at least three multi-level charge storage states being read out from said charge storage portion.

3. In a semiconductor device as defined in claim 2 wherein a predetermined voltage enabling the transfer of charge is applied to said selected first row address select line while a multi-level step voltage having at least three potential states and changing from a low voltage to a high voltage or vice versa in the direction opposite that of the read mode is applied to said second row address line forming a pair together with said first row address line, said writing means being a charge injection mechanism injecting charge from said column address line to said charge storage portion by applying a voltage pulse to said column address line at the time at which the timing thereof corresponds to the write data, the writing and reading of the charge storage state of at least three multi-level charge being carried out for said charge storage portion of an arbitrary unit memory cell.

4. The semiconductor memory as defined in claim 1 wherein each said memory cell is a one transistor memory cell comprised of one charge storage portion having a metal-insulator-semiconductor (MIS) structure or a PN junction, and an MIS type switching device having the gate thereof connected to said row address line and one semiconductor region thereof connected to said column address line, a multi-level step voltage having at least three levels and changing from a low voltage to a high voltage or vice versa is applied to one selected row address line to read the storage state of charge of at least three levels stored in said charge storage portion, and a timing detector for detecting the timing at which the charge flows out from each of said memory cells to each of said column address lines being used as said reading means.

5. The semiconductor memory as defined in claim 4 wherein a reset transistor for changing the potential of each of said bit lines from a low voltage to a high voltage or vice versa and said timing generator are used as said write mechanism, a multi-level step voltage having at least three levels and changing in the opposite direction to the read mode, that is, from a high voltage to a low voltage or vice versa, is applied to said selected row address line, said reset transistor being operated at the timing at which the potenital thereof corresponds to the write data so that the storage state of the multi-level charge of at least three levels are simultaneously written into a plurality of said memory cells by changing the potentials of said column address lines.

6. The semiconductor memory as defined in claim 4 wherein a temporary memory cell is disposed as said timing detector at at least one of the ends of each of said column address lines so that said temporary memory cell stores as digital binary signal generated at the timing of flow-out of charge to said column address line or a decoded signal of said digital binary signal, thereby carrying out reading of the multi-level charge storage state.

7. The semiconductor memory as defined in claim 6 wherein said timing generator is a signal comprator, which compares the stored data of said temperoary memory cell corresponding to each of said bit lines with a digital binary signal generated in synchronism with the multi-level step voltage at the time of writing or with a decoded signal of said digital binary signal, and drives said reset transistor when both of said signals coincide with each other, thereby carrying out writing of the multi-level charge storage state.

8. A semiconductor memory according to claim 1 wherein the number N of voltage levels applied to each of said memory cells for reading and for writing, respectively, is equal to the number of charge levels which can be stored in said memory cells.

9. A semiconductor memory of an X-Y address system comprising:
   a plurality of row address lines (word lines);
   a plurality of column address lines (bit lines) disposed in parallel with one another to cross said row address lines;
   memory cells disposed at points of intersection and each holding a charge storage state having one of at least three levels;
   writing means coupled to said cells; and
   reading means coupled to said cells;
   wherein said reading means and said writing means are respectively provided for each of said column address lines;
   means for applying voltages of at least three levels in a time sequence to said memory cells selected by one row address line in the read mode or in the write mode, respectively; and
   a timing detector for detecting the timing at which the charge flows out from each of said memory cells to each of said column address lines during said read mode.

10. The memory defined in claim 9 wherein a reset transistor for changing the potential of each of said bit lines from a low voltage to a high voltage or vice versa and said timing generator are used as said writing means, a multi-level step voltage having at least three levels and changing in the opposite direct to the read mode, that is, from a high voltage to a low voltage or vice versa, is applied to said selected row address line, said reset transistor being operated at a time at which the potential thereof corresponds to the write data so that the storage state of the multi-level charge of at least three levels are simultaneously written into a plurality of said memory cells by changing the potentials of said column address lines.

11. A semiconductor memory according to claim 9 wherein the number N of voltage levels applied to each of said memory cells for reading and for writing, respectively, is equal to the number of charge levels which can be stored in said memory cells.

12. The memory defined in claim 9 wherein a temporary memory cell is disposed as said timing detector at at least one of the ends of each of said column address lines so that each said temporary memory cell stores a digital binary signal generated at a time of flowout of charge to said column address line or a decoded signal of said digital binary signal, thereby carrying out reading of the multi-level charge storage state.

13. The memory defined in claim 12 wherein said timing detector is a signal comparator that compares the stored data of said temporary memory cell corresponding to each of said bit lines with a digital binary signal generated in sychronism with the multi-level step voltage at the time of writing or with a decoded signal of said digital binary signal, and drives said reset transistor when both of said signals coincide with each other, thereby effecting writing of the multi-level charge storage state.

14. In a semiconductor device comprised of a plurality of row address select lines, a plurality of column address select lines disposed to cross said row address select lines and charge storage type semiconductor memory cells each comprised of on e MIS (Metal-Instructor-Semiconductor) type charge storage portion and one isnulated gate transistor (MIS-FET) and disposed at the points of intersection, the gate of each of said MIS-FET being connected to the first of said row address select line, the source or drain of each said MIS-FET being connected to said column address select line, and a plate electrode of said charge storing portion being connected to a second of said row address select lines disposed in parallel with said first row address select line; the semiconductor device using a multiple level storage structure as defined in claim 9, wherein said semicodnuctor device is equipped with a reading means and a writing means, a binary voltage corresponding to the selection and non-selection of the rows being applied to said first row address line, a multi-level step voltage having more than two potential states and changing from a high voltage to a low voltage or vice versa being applied to the second row address line forming a pair together with a selected first row address, said reading means being a timing detector which detects the time at which the charge flows out from said charge storage portion of each of said memory cell to each of column address lines, and at least three-multi-level charge storage states being read out from said charge stores portion.

15. The device defined in claim 14 wherein a predetermined voltage enabling the transfer of charge is applied to said selected first row address select line while a multi-level step voltage having at least three potential states and changing from a low voltage to a high voltage or vice versa in the direction opposite that of the read mode is applied to said second row address line forming a pair together with said first row address line, said writing means being a charge injection mechanism injecting charge from said column address line to said charge storate portion by applying a voltalge pulse to said column address line at the time at which the timing thereof corresponds to the write data, and writing and reading of the charge storage of at least three multi-level charge being effected for said charge portion of an arbitrary unit memory cell.

* * * * *